(12) United States Patent
Komai

(10) Patent No.: US 8,730,740 B2
(45) Date of Patent: May 20, 2014

(54) SEMICONDUCTOR MEMORY DEVICE

(75) Inventor: Hiromitsu Komai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 13/424,423

(22) Filed: Mar. 20, 2012

(65) Prior Publication Data

US 2012/0314504 A1  Dec. 13, 2012

(30) Foreign Application Priority Data

Jun. 8, 2011  (JP) .................................. 2011-128631

(51) Int. Cl.
*G11C 11/34* (2006.01)

(52) U.S. Cl.
USPC .................. 365/185.22; 365/236; 365/189.05

(58) Field of Classification Search
USPC .................................. 365/185.22, 236, 189.05
See application file for complete search history.

(56) References Cited

U.S. PATENT DOCUMENTS

| 7,468,909 B2 * | 12/2008 | Yano et al. ................ 365/185.05 |
| 7,813,174 B2 | 10/2010 | Shibata et al. |
| 2011/0205806 A1 | 8/2011 | Yoshihara et al. |

FOREIGN PATENT DOCUMENTS

JP  3935139  3/2007

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a semiconductor memory device includes units each including memory cells, a data bus connected to each of the units and having data lines, holding circuits configured to hold fail information supplied from the unit through the data bus as a verify result after writing data, and provided in association with the data lines, respectively, daisy chain circuits configured to shift a flag includes a logical sum of the fail information held in the holding circuits, and provided in association with the data lines, respectively, and a search circuit configured to search for fail bits in the units based on the flag.

14 Claims, 15 Drawing Sheets

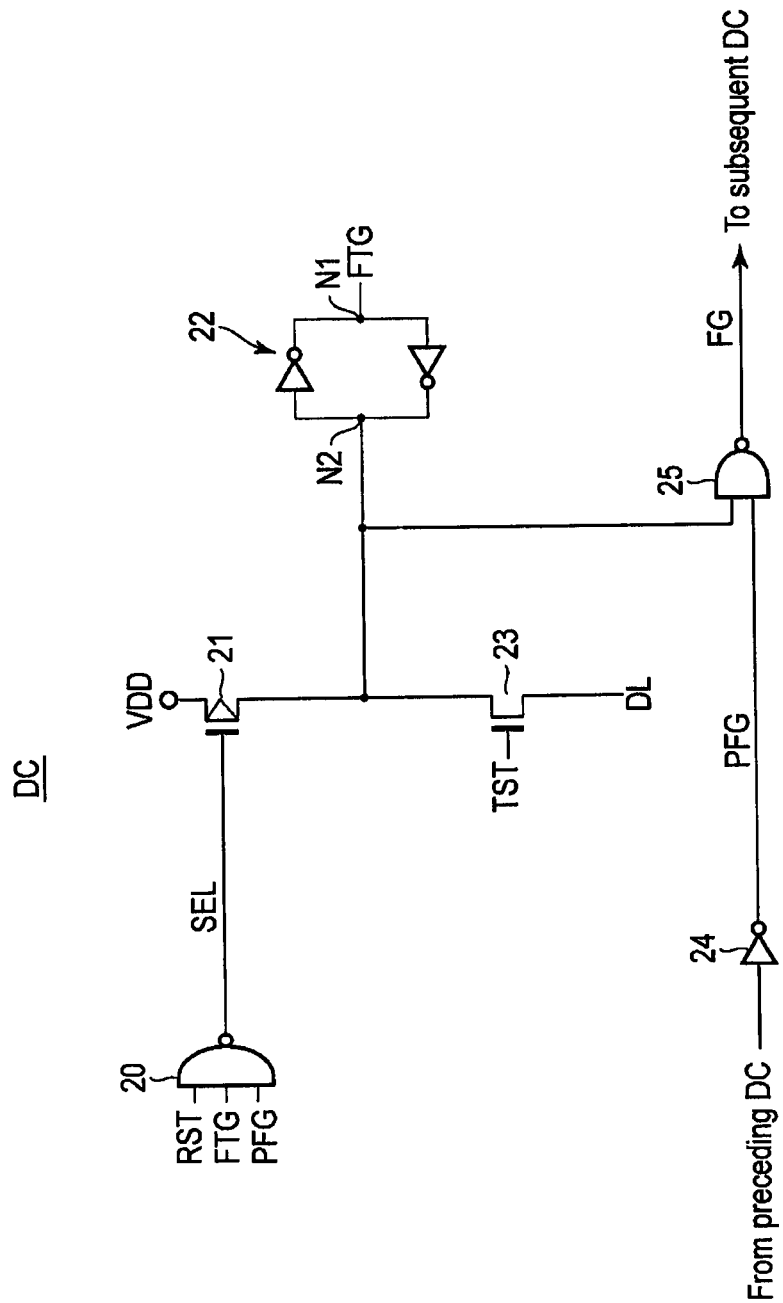
F I G. 5

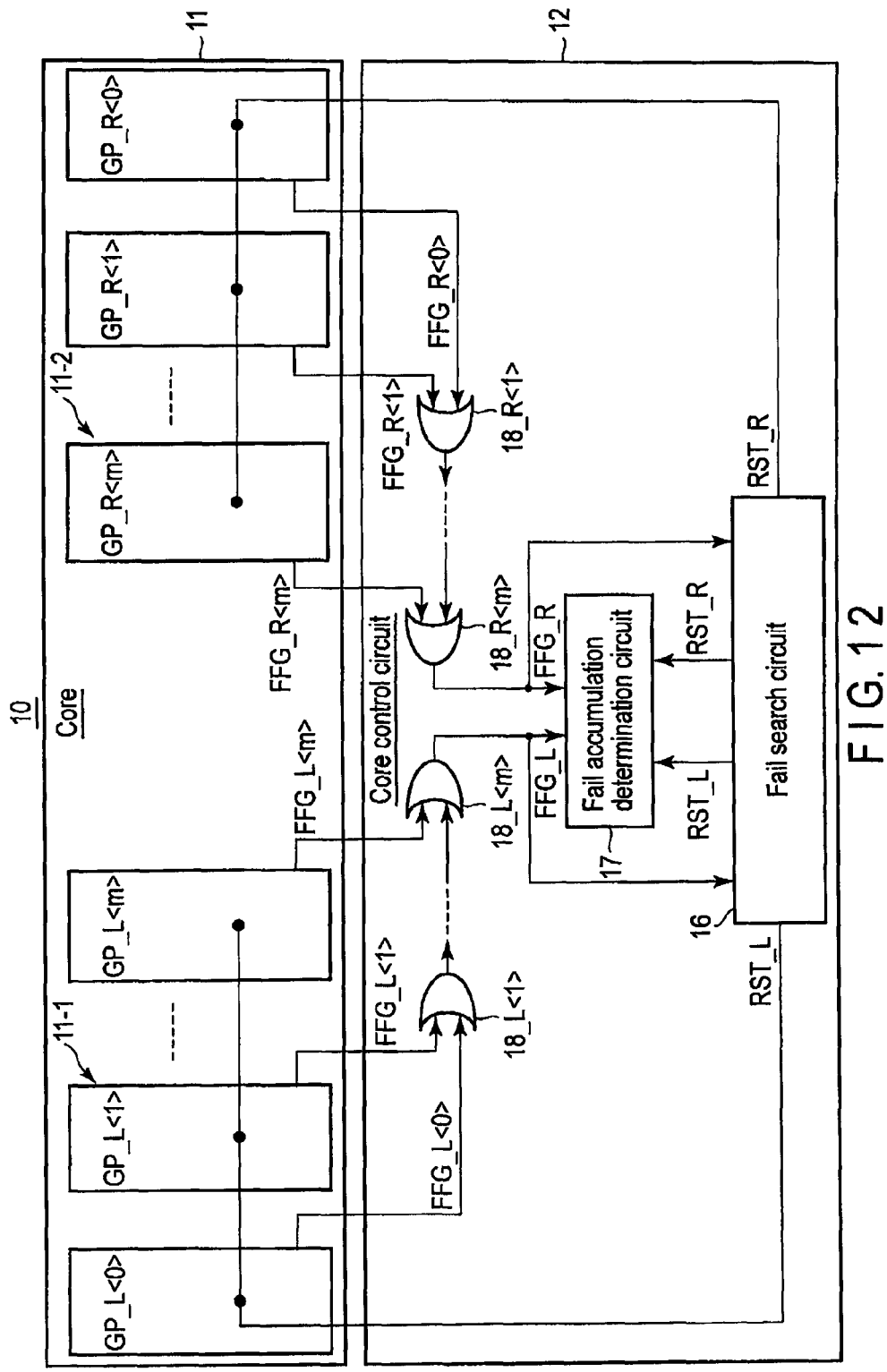
F I G. 12

US 8,730,740 B2

SEMICONDUCTOR MEMORY DEVICE

CROSS-REFERENCE TO RELATED APPLICATIONS

This application is based upon and claims the benefit of priority from prior Japanese Patent Application No. 2011-128631, filed Jun. 8, 2011, the entire contents of which are incorporated herein by reference.

FIELD

Embodiments described herein relate generally to a semiconductor memory device.

BACKGROUND

As one type of nonvolatile semiconductor memory device, a NAND flash memory is known. In the NAND flash memory, data is written in units called page. In case of writing data in the NAND flash memory, it is difficult to accurately write the data into all memory cells by a single write operation. Therefore, in a write sequence in the NAND flash memory, a write stage constituted of three steps, i.e., (1) writing, (2) verifying, and (3) searching and counting memory cells (fail bits) in which writing is not finished is repeated.

Further, there is also known a system that allows fail bits and finishes a write sequence if the number of the fail bits is not greater than a predetermined allowable bit number. Adopting this system enables increasing a data write speed. To use this system, a circuit that counts the number of fail bits is required.

BRIEF DESCRIPTION OF THE DRAWINGS

FIG. 5 is a circuit diagram showing a daisy chain circuit depicted in FIG. 2;

FIG. 12 is a block diagram showing a NAND flash memory according to a second embodiment;

DETAILED DESCRIPTION

Figure 1:
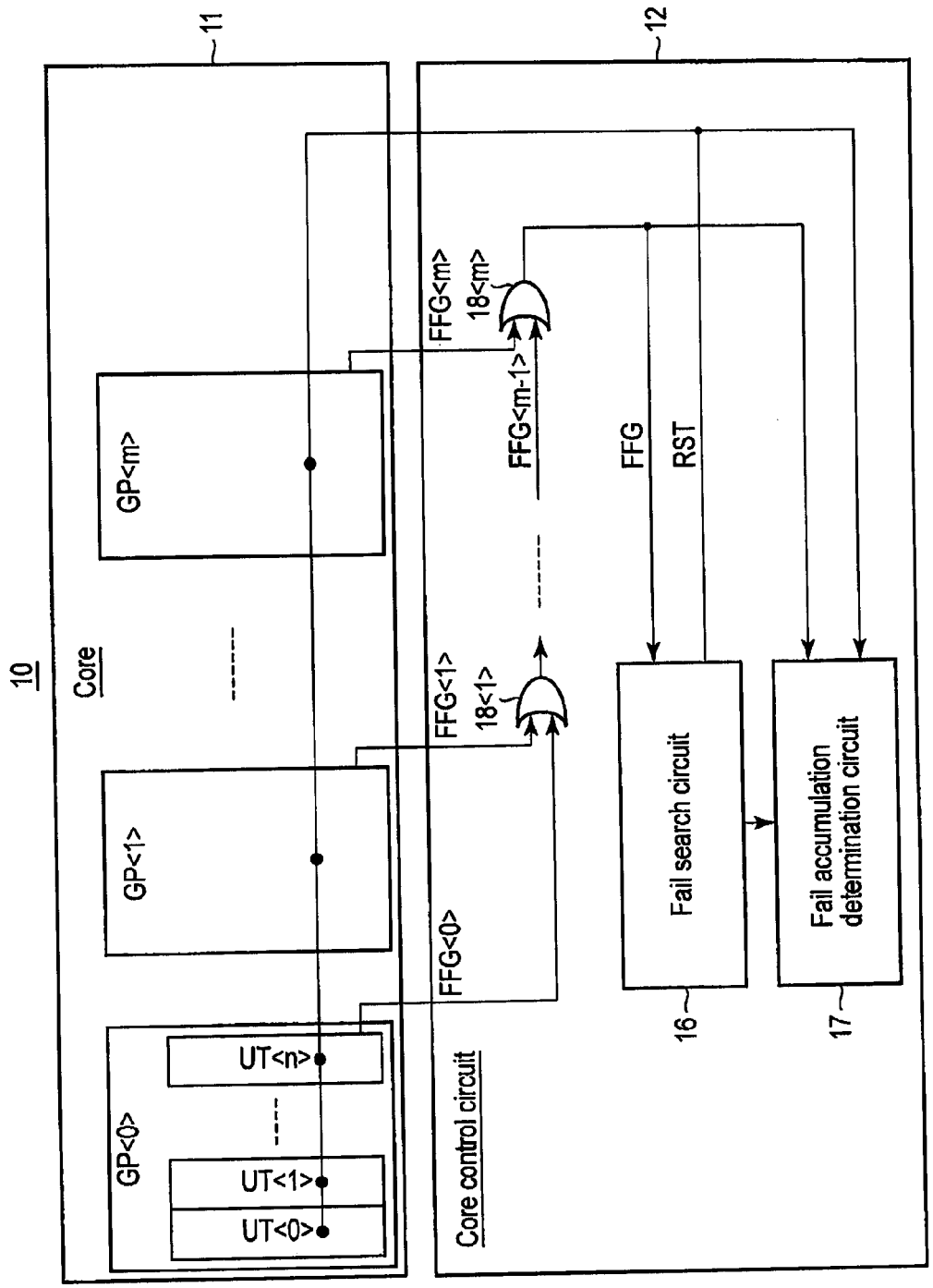
FIG. 1 is a block diagram showing a NAND flash memory according to a first embodiment.

In general, according to one embodiment, there is provided a semiconductor memory device comprising:

units each including memory cells;

a data bus connected to each of the units and having data lines;

holding circuits configured to hold fail information supplied from the unit through the data bus as a verify result after writing data, and provided in association with the data lines, respectively;

daisy chain circuits configured to shift a flag comprising a logical sum of the fail information held in the holding circuits, and provided in association with the data lines, respectively; and a search circuit configured to search for fail bits in the units based on the flag.

The embodiments will be described hereinafter with reference to the accompanying drawings. In the description which follows, the same or functionally equivalent elements are denoted by the same reference numerals, to thereby simplify the description.

First Embodiment

A NAND flash memory will be taken as an example to describe a semiconductor memory device according to a first embodiment.

[1. Configuration of NAND Flash Memory 10]

FIG. 1 is a block diagram showing a configuration of a NAND flash memory 10 according to the first embodiment. The NAND flash memory 10 comprises a core 11 including a memory cell array and a core control circuit 12 that controls the core 11. The core 11 comprises (m+1) groups GP<0> to GP<m>. The "m" is an integer equal to or above 0. Each of the groups GP<0> to GP<m> includes (n+1) units UT<0> to UT<n>. The "n" is an integer equal to or above 0.

Figure 2:
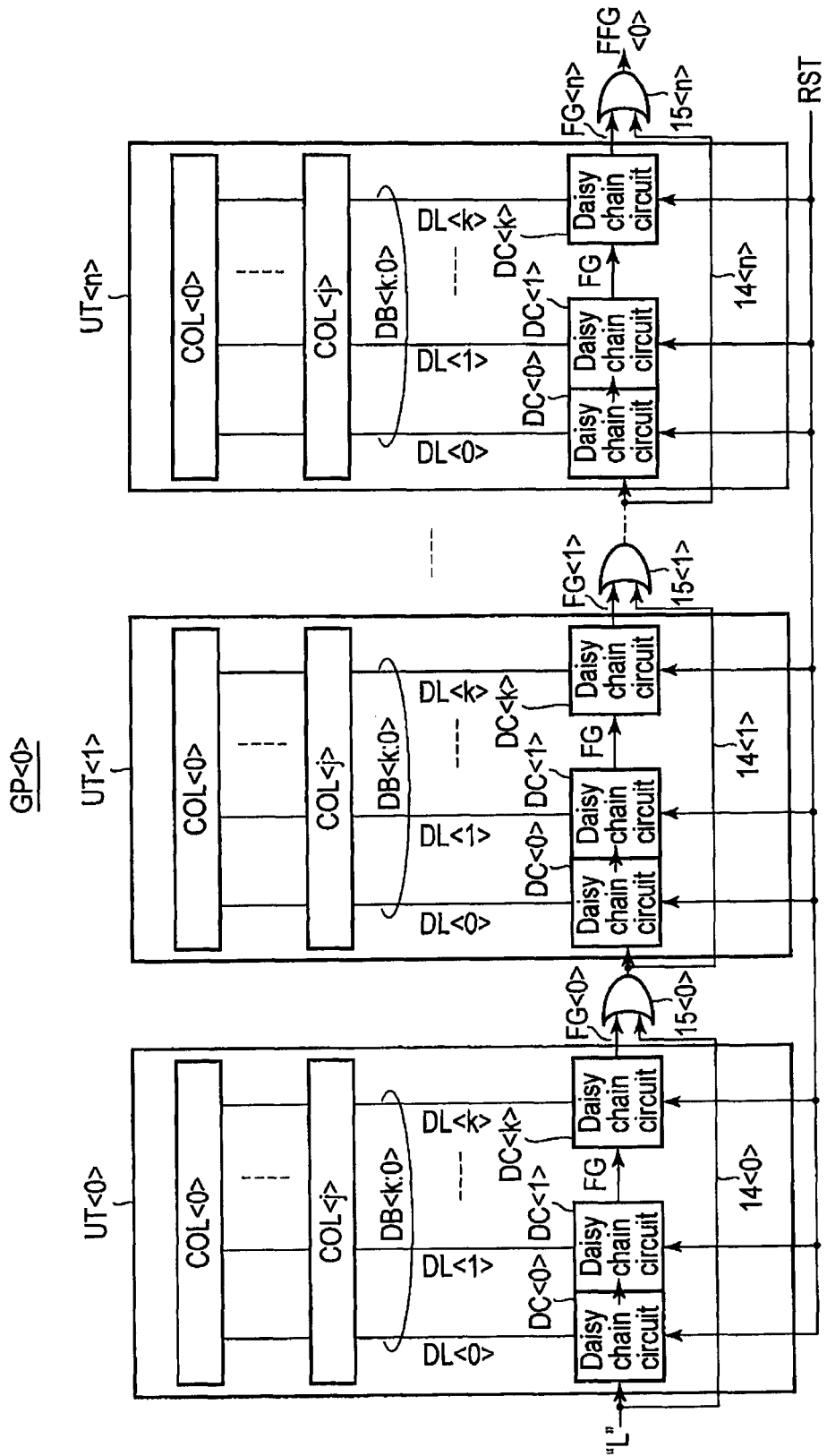
FIG. 2 is a block diagram showing a configuration of a group depicted in FIG. 1.

FIG. 2 is a block diagram showing a configuration of one group GP<0>. The groups GP<1> to GP<m> have the same configuration as that depicted in FIG. 2. Each unit UT comprises (j+1) columns COL<0> to COL<j>. The "j" is an integer equal to or above 0. The columns COL<0> to COL<j> are connected to a data bus DB<k:0> consisting of (k+1) bits in common. The "k" is an integer equal to or above 0. That is, the respective units UT are configured so that they can read data of (k+1) bits at the same time. The data bus DB<k:0> is constituted of (k+1) data lines DL<0> to DL<k>.

Figure 3:
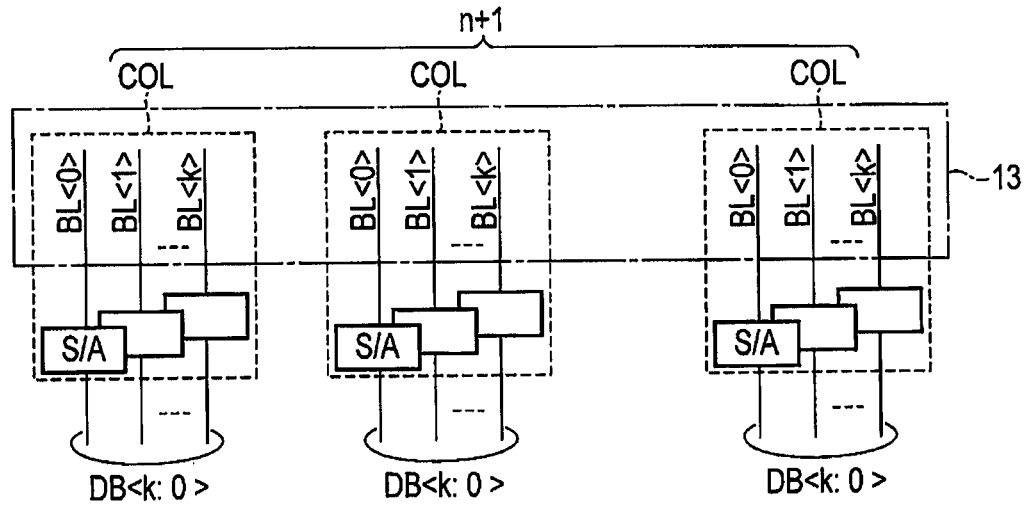
FIG. 3 is a block diagram showing a configuration of a column depicted in FIG. 2.

FIG. 3 is a block diagram showing a configuration of, each column COL. One column COL comprises (k+1) bit lines BL<0> to BL<k> arranged in a memory cell array 13 and (k+1) sense amplifiers S/A connected to the bit lines BL<0> to BL<k>, respectively. The number of the bit lines BL is associated with the number of the data lines DL included in the data bus DB<k:0>. The (k+1) sense amplifiers S/A are connected to the (k+1) data lines included in the data bus <k:0>, respectively.

Figure 4:
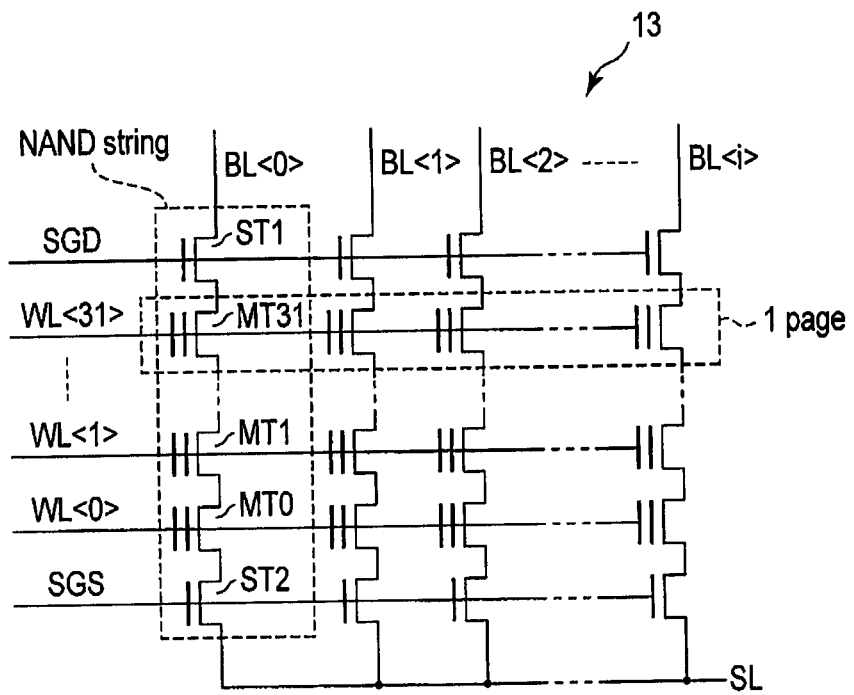
FIG. 4 is a circuit diagram showing a memory cell array.

FIG. 4 is a circuit diagram showing a configuration of the memory cell array 13. It is to be noted that the memory cell array 13 in FIG. 4 corresponds to a memory cell array included in the (n+1) columns COL<0> aligned in a row direction in FIG. 2.

The memory cell array 13 comprises NAND strings which are associated with the bit lines BL<0> to BL<i> in number.

The "i" is an integer equal to or above n. Each NAND string comprises, e.g., 32 memory cell transistors MT0 to MT31 and two selection transistors ST1 and ST2. As each of the selection transistors ST1 and ST2, for example, an N-channel MOSFET is used. The memory cell transistor MT has a stacked gate structure having a charge storage layer (e.g., a floating gate electrode) formed on a semiconductor substrate through a gate insulating film and a control gate electrode formed on the charge storage layer through an inter-gate insulating film. The memory cell transistor MT is not restricted to the floating gate structure, and it may have a metal oxide nitride oxide silicon (MONOS) structure adopting a system for trapping electrons in an insulating film (e.g., a nitride film) as the charge storage layer. The memory cell transistor MT can store data of, e.g., 1 bit in accordance with a change in threshold voltage based on the quantity of electrons injected in the charge storage layer.

Current paths of the memory cell transistors MT adjacent to each other in the NAND string are connected in series. A drain of the series-connected memory cell transistors MT on one end side is connected to a source of the selection transistor ST1, and a source of the same on the other end side is connected to a drain of the selection transistor ST2.

Control gate electrodes of the memory cell transistors MT provided in the same row are connected to one of word lines WL<0> to WL<31> in common. Gate electrodes of the selection transistors ST1 provided in the same row are connected to a selection gate line SGD in common, and gate electrodes of the selection transistors ST2 provided in the same row are connected to a selection gate line SGS in common. Drains of the selection transistors ST1 in the same row are connected to the bit lines BL<0> to BL<i>, respectively. Sources of the selection transistors ST2 provided in the same row are connected to a source line SL in common.

The memory cell transistors MT connected to the same word line WL constitute a page. Writing and reading data are collectively carried out with respect to the memory cell transistors MT in one page. Further, the memory cell array 13 is configured so that data in pages can be erased collectively, and a unit of this erase operation is called a block.

At the time of reading data, the sense amplifier S/A in FIG. 3 detects and amplifies data in a selected memory cell transistor MT through the bit line BL and temporarily holds this detected read data.

Furthermore, at the time of writing data, the sense amplifier S/A temporarily holds write data and transfers the write data to the bit line BL. Moreover, the sense amplifier S/A executes the same processing as a read operation at the time of verifying whether the write data has been correctly written in the memory cell transistor MT. Moreover, the sense amplifier S/A compares with write data with read data and detects whether the memory cell transistor MT as a write target corresponds to a fail bit. The fail bit means that write data disagrees with data which has been already written in the memory cell transistor MT as the write target.

In FIG. 2, each unit UT comprises (k+1) daisy chain circuits DC<0> to DC<k> connected to the data lines DL constituting the data bus DB<k:0>.

The daisy chain circuits DC<0> to DC<k> included in each unit UT are connected in series and sequentially shift a flag FG. That is, the daisy chain circuits DC<0> to DC<k> output a logical sum of fail information of the data bus DB<k:0> as the flag FG. Each daisy chain circuit DC outputs the flag FG on a low level when the flag FG of a preceding daisy chain circuit DC is inactive (the low level) and a bit of itself corresponds to pass. On the other hand, each daisy chain circuit DC outputs the flag FG on a high level when the flag FG of the preceding daisy chain circuit DC is active (the high level) or the bit of itself corresponds to fail. Therefore, the daisy chain circuit is configured to include a latch circuit which holds pass/fail information of a bit corresponding to the data line DL, a circuit which generates the flag FG, and others. A specific configuration of the daisy chain circuit DC will be described later.

The units UT<0> to UT<n> comprise flag bypasses 14<0> to 14<n>, respectively. The flag bypass 14<n> of the unit UT<n> is configured to bypass the flag FG of the preceding unit UT<n-1> to an output of the unit UT<n>. The flag FG<n> output from the unit UT<n> and the flag bypass 14<n> are subjected to an arithmetic operation of a logical sum by an OR gate 15<n>. The other flag bypasses 14 and OR gates 15 have the same configurations as those of the flag bypass 14<n> and the OR gate 15<n>. The OR gate 15<n> at a last stage outputs a fail flag FFG<0>. Therefore, the fail flag FFG output from one group GP corresponds to a logical sum of fail information of the units UT<0> to UT<n> included in this group GP.

As shown in FIG. 1, the groups GP<0> to GP<m> output fail flags FFG<0> to FFG<m>, respectively. The fail flag FFG<m> of the group GP<m> and the fail flag FFG<m-1> of the preceding group GP<m-1> are subjected to an arithmetic operation to obtain a logical sum by an OR gate 18<m>. The other OR gates have the same configuration as that of the OR gate 18<m>. Therefore, the fail flag FFG output from the OR gate 18<m> at a last stage corresponds to a logical sum of fail information of the groups GP<0> to GP<m>.

The core control circuit 12 comprises a fail search circuit 16 and a fail accumulation determination circuit 17. The fail search circuit 16 controls a fail bit search operation for searching for fail bits in the units UT. The fail search circuit 16 generates a reset signal RST every cycle of the fail bit search operation while monitoring the fail flags FFG. The reset signal RST is supplied to each daisy chain circuit DC and the fail accumulation determination circuit 17.

The fail accumulation determination circuit 17 is configured to include a counter which uses the reset signal RST as a trigger to count up fail accumulation count values. The fail accumulation determination circuit 17 counts up the reset signals RST until fail bits are no longer present in a page where writing has been carried out or until a fail accumulation count value exceeds the allowable bit number. The fail accumulation count value counted by the fail accumulation determination circuit 17 corresponds to the number of fail bits in programmed bits.

<Configuration of Daisy Chain Circuit>

FIG. 5 is a circuit diagram showing a configuration of a single daisy chain circuit DC. A latch circuit 22 is constituted of two inverters and holds pass/fail information (a fail tag FTG). The fail tag FTG is changed to the high level when the data line DL corresponds to fail. The fail tag FTG is held in a node N1 of the latch circuit 22.

A drain of an N-channel MOSFET 23 is connected to a node N2 of the latch circuit 22. A source of the N-channel MOSFET 23 is connected to the data line DL. A tag set signal TST is input to a gate of the N-channel MOSFET 23 from the core control circuit 12. The N-channel MOSFET 23 transfers a logic of the data line DL to the latch circuit 22 when the tag set signal TST is changed to the high level.

The node N2 of the latch circuit 22 is connected to an input terminal of a NAND gate 25. The NAND gate 25 outputs a flag FG. The flag FG from the preceding daisy chain circuit is input to an inverter 24. The inverter 24 outputs a pre-flag PFG obtained by inverting the flag FG of the preceding daisy chain circuit, and the pre-flag PFG is input to the NAND gates 20 and 25. The flag FG output from the NAND gate 25 is set to the low level when the fail tag FTG of this gate is on the low level and the fail tag FTG from the preceding daisy chain circuit is on the low level.

To the NAND gate 20 are input the fail tag FTG held in the latch circuit 22 and the reset signal RST from the fail search circuit 16 besides the pre-flag PFG. The NAND gate 20 outputs a selection signal SEL, and this selection signal SEL is input to a gate of a P-channel MOSFET 21. The NAND gate 20 activates (the low level) the selection signal SEL when three conditions are met, namely, (1) the reset signal RST is activated (the high level), (2), the data line DL corresponds to fail, i.e., the fail tag FTG is on the high level, and (3) the flag of the preceding daisy chain circuit is inactive (the low level), i.e., the pre-flag PFG is on the high level.

A source of the P-channel MOSFET 21 is connected to a power supply terminal VDD. A drain of the P-channel MOSFET 21 is connected to the node N2 of the latch circuit 22. The P-channel MOSFET 21 resets the latch circuit 22, i.e., sets the fail tag FTG to the low level when the selection signal SEL is changed to the low level.

[2. Operation]

An operation of the NAND flash memory 10 will now be described.

<Operation of Program Sequence>

Figure 6:
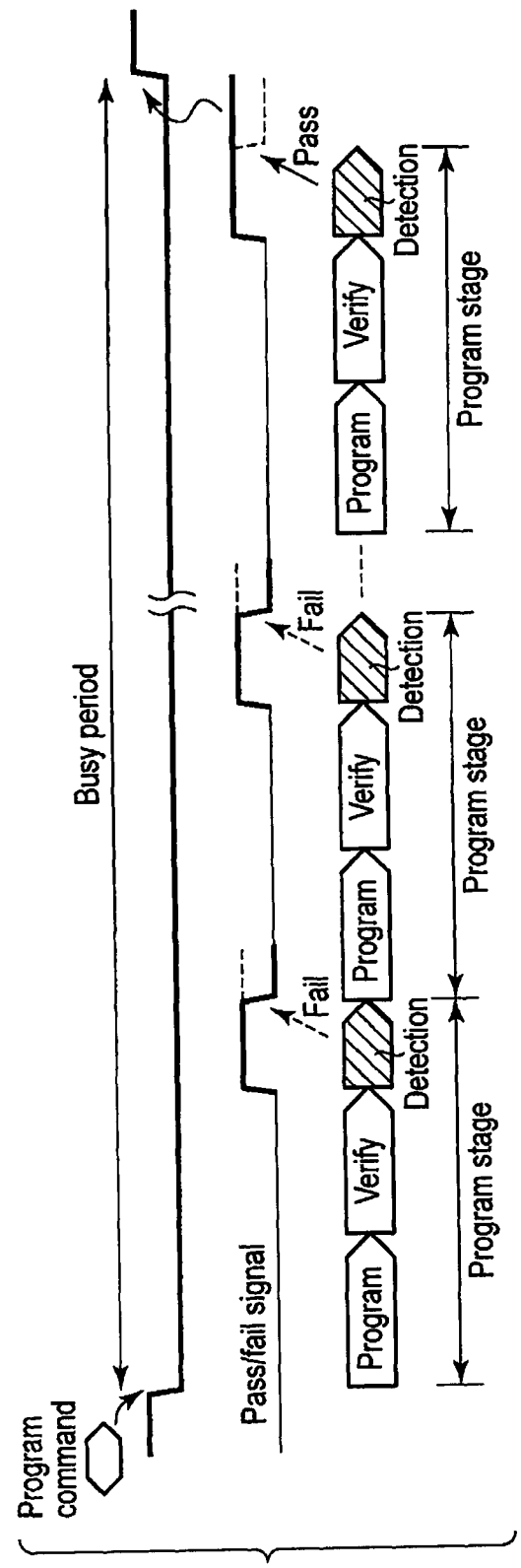
FIG. 6 is a timing chart showing a program sequence of the NAND flash memory.

A write (program) sequence of the NAND flash memory 10 will be first explained. FIG. 6 is a timing chart showing the program sequence of the NAND flash memory 10.

When a program command is issued from the outside, the NAND flash memory 10 enters a busy state, and the program sequence begins. First, a program operation is carried out, whereby a first program is executed with respect to the memory cell array 13 in pages.

Subsequently, a verify operation is effected with respect to a programmed memory cell transistor MT. In the verify operation, data is internally read with respect to the programmed memory cell transistor MT, and information indicating whether the program has been accurately executed (pass/fail information) is stored in the sense amplifier S/A.

When the verify operation is finished, a fail detecting operation is carried out. In the fail detecting operation, the pass/fail information stored in the sense amplifier S/A by the verify operation is read to the daisy chain circuit, and whether a fail bit is present is determined. The three operations, i.e., the program operation, the verify operation, and the fail detecting operation are generically called a program stage.

As a result of the fail detecting operation, a pass/fail signal indicating whether the program corresponds to pass or fail is generated. The NAND flash memory 10 executes a second program stage when the program corresponds to fail, and the NAND flash memory 10 exits from the program sequence to return to a ready state when the program corresponds to pass. The program stage is repeated until the program passes, and the program sequence is terminated when the program does not pass even though the number of times of the program stage exceeds a specified number of times.

Figure 7:
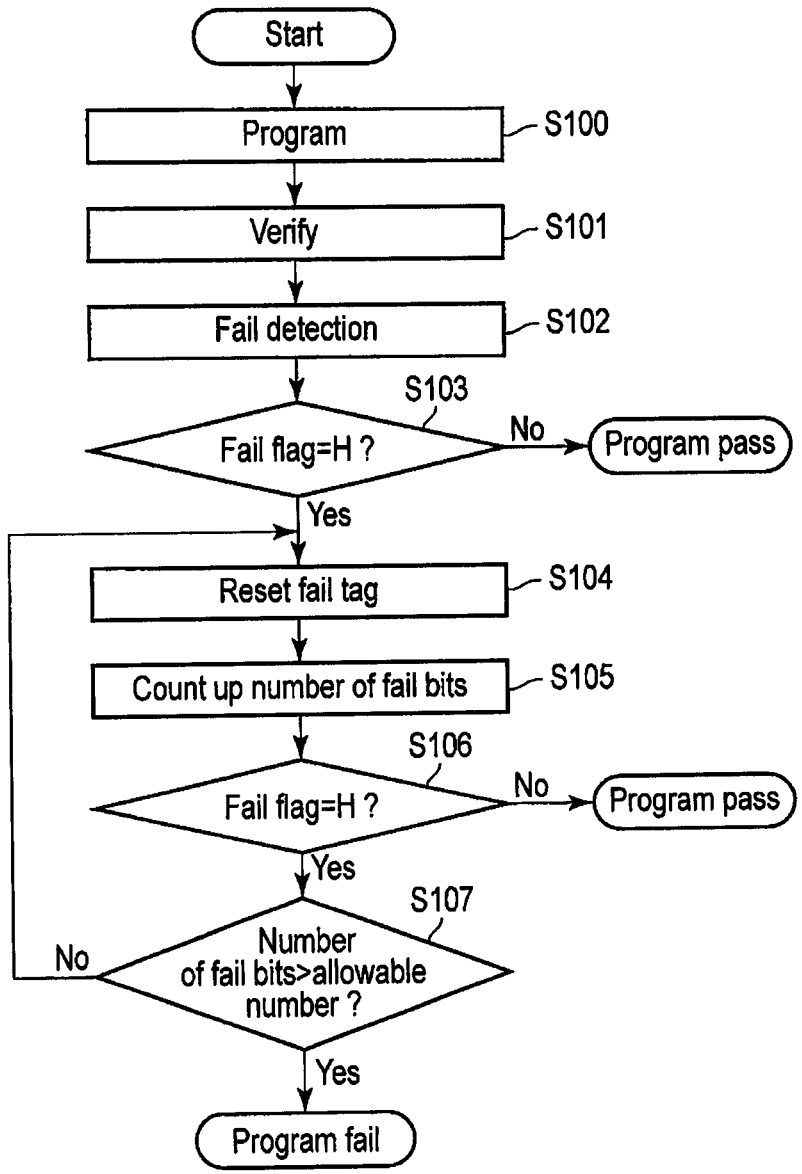
FIG. 7 is a flowchart showing the program sequence of the NAND flash memory.

Specific processing of the program sequence of the NAND flash memory 10 will now be described. FIG. 7 is a flowchart showing the program sequence of the NAND flash memory 10.

The program operation is first carried out (a step S100). This program operation can be executed by a known method. Subsequently, the verify operation is performed (a step S101). The verify operation can be also executed by a known method. In the verify operation, data is internally read with respect to the programmed memory cell transistor MT. Moreover, the pass/fail information indicative of a verify result is stored in the sense amplifier S/A provided in accordance with each bit.

Then, the fail detecting operation is carried out (a step S102). First, the core control circuit 12 first activates (the high level) a tag set signal TST. As a result, the N-channel MOSFET 23 of each daisy chain circuit DC is turned on, and the latch circuit 22 of each daisy chain circuit DC stores the pass/fail information of the sense amplifier S/A as the fail tag FTG through the data line DL. When a bit corresponds to fail, the data line DL is set to the low level, and the fail tag FTG of the latch circuit 22 is set to the high level. On the other hand, when the bit corresponds to pass, the data line DL is set to the high level, and the fail tag FTG of the latch circuit 22 is set to the low level.

When a bit of a given daisy chain circuit DC corresponds to pass, the node N2 of the latch circuit 22 is set to the high level. Therefore, under the condition that the flag FG of the preceding daisy chain circuit DC is on the low level, the flag FG of the daisy chain is also set to the low level. It is to be noted that the low-level flag FG is input from the core control circuit 12 to the daisy chain circuit DC at the first stage. Therefore, when all programmed bits correspond to pass (a step S103), the fail flag FFG input to the fail search circuit 16 is set to the low level, and the program passes.

On the other hand, when a given daisy chain circuit DC has a fail bit, the node N2 of the latch circuit 22 is changed to the low level. Therefore, the flag FG of the daisy chain circuit DC is set to the high level irrespective of the flag FG of the preceding daisy chain circuit DC. Accordingly, the fail flag FFG is changed to the high level, and fail bit search is executed.

In the fail bit search, the fail search circuit 16 sets the reset signal RST to the high level. As a result, a given NAND gate 20 sets the selection signal SEL to the low level when three conditions are met, namely, (1) the reset signal RST is set to the high level, (2) the fail tag FTG is on the high level, and (3) the pre-flag PFG is on the high level. In short, when setting the reset signal RST to the high level is used as a trigger, a bit of the daisy chain circuit DC in question corresponds to fail, and bits of the preceding daisy chain circuits DC correspond to pass or the fail tag FTG is reset, the NAND gate 20 sets the selection signal SEL to the low level.

When the selection signal SEL is changed to the low level, the P-channel MOSFET 21 is turned on, and the latch circuit 22 is reset, namely, the fail tag FTG of the latch circuit 22 is set to the low level (a step S104). Additionally, the fail accumulation determination circuit 17 counts up the accumulated fail count value associated with the number of fail bits when the reset signal RST is changed to the high level (a step S105).

After resetting the fail tag FTG of the daisy chain circuit DC selected by the selection signal SEL, the fail search circuit 16 again determines whether the fail flag FFG is on the high level (S106). When the fail flag FFG is on the low level, the search for the fail bits is assumed to be finished, and the program passes.

When the fail flag FFG remains on the high level at the step S106, the fail accumulation determination circuit 17 determines whether the number of fail bits (the accumulated fail count value) is not greater than an allowable fail number (an allowable number) (a step S107). When the number of fail bits is not greater than the allowable fail number, the fail search circuit 16 repeats the fail bit search operation. On the other hand, when the number of fail bits exceeds the allowable fail number at the step S107, the program fails, and the program stage is again executed. It is to be noted that, when the program does not pass even though the number of times of the program stage exceeds the specified number of times, the program sequence is terminated.

Figure 8:
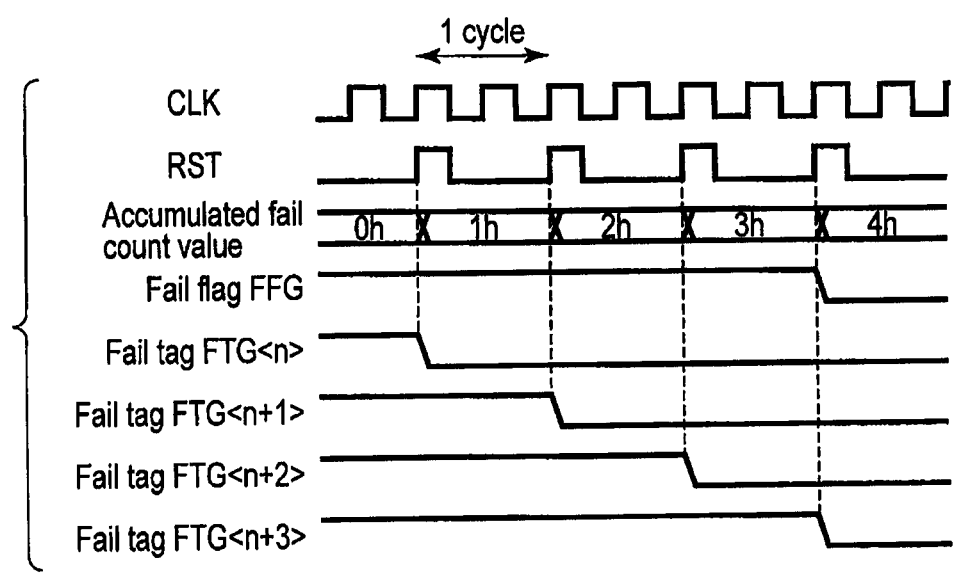
FIG. 8 is a timing chart showing a fail bit search operation.

FIG. 8 is a timing chart showing the fail bit search operation. The core control circuit 12 operates in synchronization with a clock signal CLK. A latch circuit 22<n> of a given daisy chain circuit DC<n> stores a fail tag FTG<n> on the high level. When the reset signal RST is changed to the high level, the latch circuit 22<n> is reset, and the fail tag FTG<n> is set to the low level. At this time, the fail accumulation determination circuit 17 counts up the accumulated fail count value by 1. "h" in FIG. 8 represents hexadecimal notation. At this moment, since the fail flag FFG remains on the high level, a fail bit is still present.

Likewise, fail tags FTG<n+1> and FTG<n+2> are reset, and the fail accumulation determination circuit 17 counts up the accumulated fail count value by 2. Subsequently, a fail tag FTG<n+3> is reset, the fail accumulation determination circuit 17 counts up the accumulated fail count value by 1. At this moment, since the fail flag FFG is on the low level, the core control circuit 12 terminates the fail search for all bits in this program stage.

As shown in FIG. 2, in the fail search operation, the flag bypass 14 bypasses the flag shifting operation of the daisy chain circuits DC in the unit UT whose bits have all passed. Therefore, even if the program stage is repeated, a time required for the fail search operation can be shortened.

[3. Structural Example of Daisy Chain Circuit]

Figure 9:
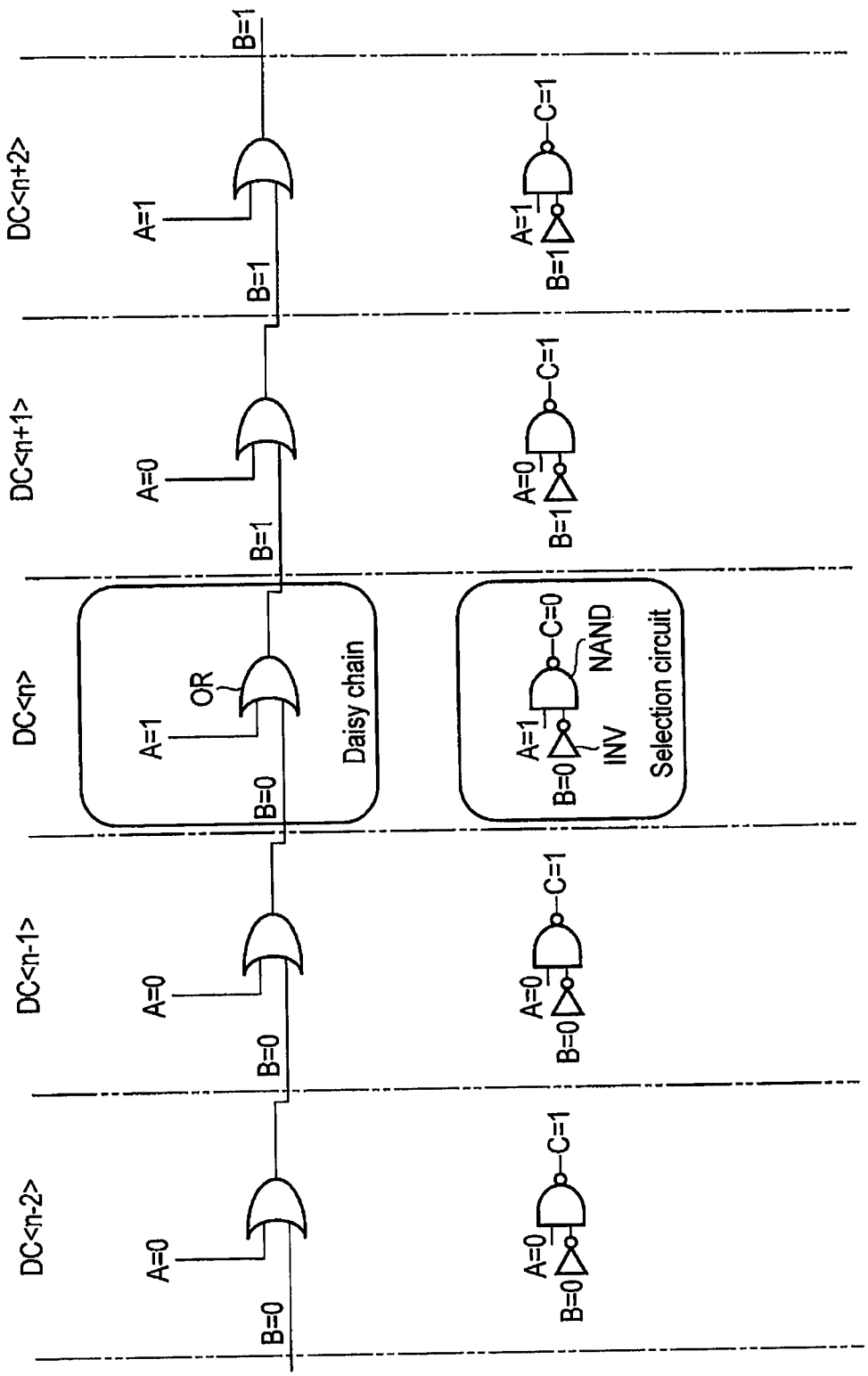
FIG. 9 is a schematic view for explaining a logic operation of the daisy chain circuit.

FIG. 9 is a schematic view for explaining a logic operation of the daisy chain circuits DC. The daisy chain circuits DC connected in series are configured in such a manner that, if a terminal A of a given daisy chain circuit DC<n>="1 (the high level)", "1" is output from a last output terminal B of the daisy chain circuits DC. Further, if a terminal B of a given daisy chain circuit="0 (the low level)", terminals A of all the daisy chain circuits that precede this daisy chain circuit do not have "1". Therefore, a logic of a terminal C is determined based on logics of the terminal A and the terminal B, and checking the terminal C enables specifying one daisy chain circuit. For example, one daisy chain circuit DC is constituted of an OR gate, an inverter INV, and a NAND gate ND.

When this daisy chain system is applied to the fail bit search according to this embodiment, the terminal A=the fail tag FTG, the terminal B=the pre-flag PFG, and the terminal C=the selection signal SEL are achieved. Therefore, if a selected daisy chain circuit has a fail bit, the fail tag FTG=1 is achieved, and information "1" is shifted to each daisy chain circuit, thus resulting in the fail flag FFG which is the last output terminal=1. When the fail tag FTG is reset, the flag FG output from the daisy chain circuit is also set to "0", and the pre-flag PFG "0" continues to the daisy chain having the fail tag FTG=1.

When the daisy chain system is used in this manner, the core control circuit 12 can automatically select one daisy chain circuit that executes the fail bit count by just toggling the reset signal RST.

Figure 10:
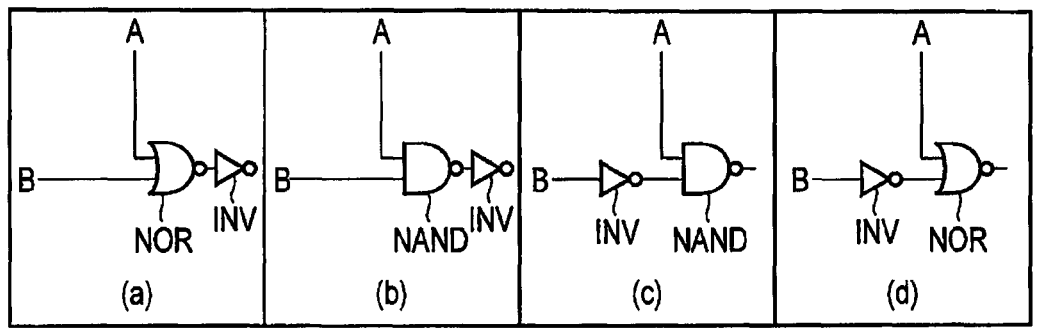
FIG. 10 shows another structural example of the daisy chain depicted in FIG. 9.

FIG. 10 shows another structural example of the daisy chain depicted in FIG. 9. In FIG. 10(a), a daisy chain is formed of an NOR gate and an inverter INV. In FIG. 10(b), a daisy chain is formed of a NAND gate and an inverter INV. In FIG. 10(c), a daisy chain is formed of an inverter INV and an NOR gate. In FIG. 10(d), a daisy chain is formed of an inverter INV and an NOR gate.

Figure 11:
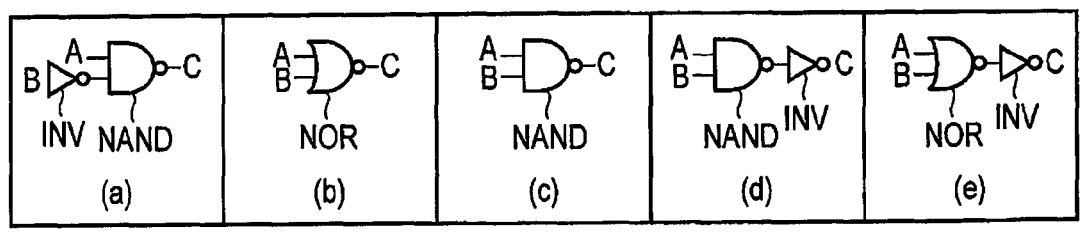
FIG. 11 shows another structural example of a selection circuit depicted in FIG. 9.

FIG. 11 shows still another structural example of the selection circuit depicted in FIG. 9. In FIG. 11(a), a selection circuit is formed of an inverter INV and a NAND gate. In FIG. 11(b), a selection circuit is formed of an NOR gate. In FIG. 11(c), a selection circuit is formed of a NAND gate. In FIG. 11(d), a selection circuit is formed of a NAND gate and an inverter INV. In FIG. 11(e), a selection circuit is formed of an NOR gate and an inverter INV.

The daisy chain circuit DC is not restricted to the configuration depicted in FIG. 5, and it can be realized by arbitrarily combining such logical operation circuits having various patterns as depicted in FIG. 9 to FIG. 11.

[4. Effect]

As described above, in the first embodiment, each unit UT has the data bus DB<k:0> connected to the columns COL in common and comprises the daisy chain circuits connected to the data lines DL<0> to DL<k> constituting each data bus DB<k:0>. Each of the daisy chain circuits DC<0> to DC<k> comprises the latch circuit 22 which holds fail information as the fail tag FTG and is configured to shift a logical sum of the fail information as the flag FG. Further, the fail search circuit 16 generates the reset signal RST every time it searches for a fail bit, and the latch circuit 22 of the daisy chain circuit DC which has finished the search is reset by the reset signal RST. Furthermore, the fail accumulation determination circuit 17 counts up the reset signal RST to calculate the number of fail bits (the accumulated fail count value).

Therefore, according to the first embodiment, the number of fail bits can be counted by generating the reset signal RST while monitoring the fail flag FFG (a logical sum of the fail information of the groups GP<0> to GP<m> in this embodiment) finally output from the core 11. As a result, speeds of the fail bit search operation and the count operation can be increased.

Furthermore, in regard to the unit UT having no fail bit, the flag bypass 14 enables the flag to bypass this unit. That is, since there is realized a circuit configuration that the unit UT having fails alone takes time for shifting the flag FG even when the program stage is repeated, the speed of the fail bit search operation can be increased.

Moreover, the fail accumulation determination circuit 17 can be formed of a counter. As a result, the control for counting the number of fail bits can be simplified, thereby reducing a cost.

Second Embodiment

According to a second embodiment, groups GP included in a core 11 are divided into two to be managed, and the two divided cores are configured to perform an interleave operation.

FIG. 12 is a block diagram showing a configuration of a NAND flash memory 10 according to the second embodiment. A core 11 comprises a first core 11-1 constituted of (m+1) groups GP_L<0> to GP_L<m> and a second core 11-2 constituted of (m+1) groups GP_R<0> to GP_R<m>. That is, the core 11 in the second embodiment is obtained by dividing the core described in the first embodiment into two pieces. A configuration of each of the groups GP_L and GP_R is equal to that of the group GP in the first embodiment. It is to be noted that the number of the groups GP included in the first core 11-1 may not be equal to the number of the groups GP included in the second core 11-2.

The groups GP_L<0> to GP_L<m> included in the first core 11-1 output fail flags FFG_L<0> to FFG_L<m>, respectively. The fail flag FFG_L<m> of the group GP_L<m> and the fail flag FFG_L<m-1> of the preceding group GP_L<m-1> are subjected to a logical sum operation by an OR gate 18_L<m>. Other OR gates have the same configuration as that of the OR gate 18_L<m>. Therefore, the fail flag FFG_L output from the OR gate 18_L<m> at the last stage corresponds to a logical sum of fail information of the groups GP_L<0> to GP_L<m>. The groups GP_R<0> to GP_R<m> included in the second core 11-2 output fail flags FFG_R<0> to FFG_R<m>, respectively. The fail flag FFG_R<m> of the group GP_R<m> and the fail flag FFG_R<m−1> of the preceding group GP_R<m−1> are subjected to the logical sum operation by an OR gate 18_R<m>. Other OR gates have the same configuration as that of the OR gate 18_R<m>. Therefore, the fail flag FFG_R output from the OR gate 18_R<m> at the last stage corresponds to a logical sum of fail information of the groups GP_R<0> to GP_R<m>.

A fail search circuit 16 generates a reset signal RST_L in accordance with each cycle of a fail bit search operation while monitoring the fail flag FFG_L. The reset signal RST_L is supplied to the daisy chain circuits DC in the core 11-1 and a fail accumulation determination circuit 17. Likewise, the fail search circuit 16 generates a reset signal RST_R in accordance with each cycle of the fail search operation while monitoring the fail flag FFG_R. The reset signal RST_R is supplied to the daisy chain circuits DC in the core 11-2 and the fail accumulation determination circuit 17.

The fail accumulation determination circuit 17 is configured to include a counter which counts up a fail accumulation count value by using the reset signals RST_L and RST_R as triggers. That is, the fail accumulation determination circuit 17 is configured to count up a signal which is obtained by calculating a logical sum of the reset signals RST_L and the RST_R signal. Moreover, the fail accumulation determination circuit 17 counts up the reset signals RST_L and RST_R until a page where writing has been carried out no longer has fail bits or until the fail accumulation count value exceeds an allowable bit number.

Figure 13:
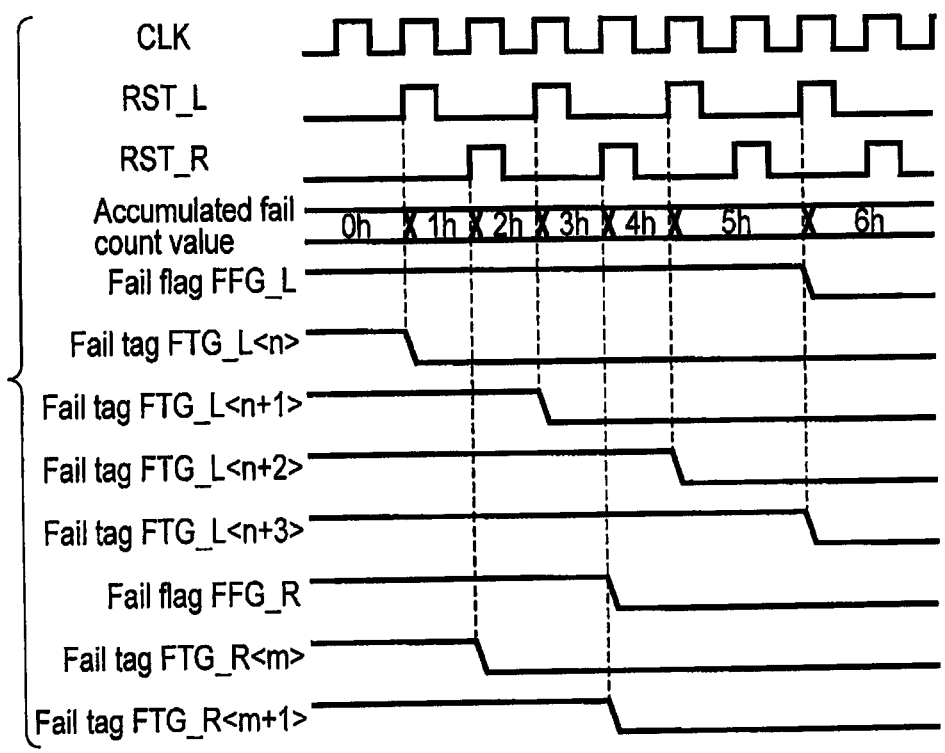
FIG. 13 is a timing chart showing a fail bit search operation.

FIG. 13 is a timing chart showing a fail bit search operation. Fail tags FTG_L<n> to FTG_L<n+3> represent fail tags included in the first core 11-1. Fail tags FTG_R<m> to FTG_R<m+1> represent fail tags included in the second core 11-2.

The fail search circuit 16 outputs the reset signal RST_L until the fail flag FFG_L is changed to a low level. The fail tags FTG_L are sequentially reset by this reset signal RST_L. Additionally, the fail search circuit 16 outputs the reset signal RST_R until the fail flag FFG_R is changed to the low level. The fail tags FTG_R are sequentially reset by this reset signal RST_R. Further, the fail search circuit 16 interleaves the reset signal RST_L which is supplied to the first core 11-1 and the reset signal RST_R which is supplied to the second core 11-2. The fail accumulation determination circuit 17 counts up a signal obtained by calculating a logical sum of the reset signals RST_L and RST_R to generate an accumulated fail count value.

Therefore, according to the second embodiment, in the fail bit search operation of the first core 11-1 and the second core 11-2, the interleave operation can be realized. As a result, a speed of the fail bit search operation of the core 11 can be increased.

It is to be noted that the reset signal and the fail flag can be supplied through the same wiring region as that in the first embodiment, and hence an areal impact when adding the reset signal and the fail flag is vanishingly small. Furthermore, when a logical sum of two reset signals input to the fail accumulation determination circuit 17 is obtained in this circuit and then input to the counter circuit, a counter circuit does not have to be increased in number, and there is no areal impact even though the interleave operation is realized. In this manner, according to the second embodiment, addition of circuits or an area increase is uninfluential, and a speed of the fail bit search operation can be further increased as compared with the first embodiment.

Comparative Example

Figure 14:
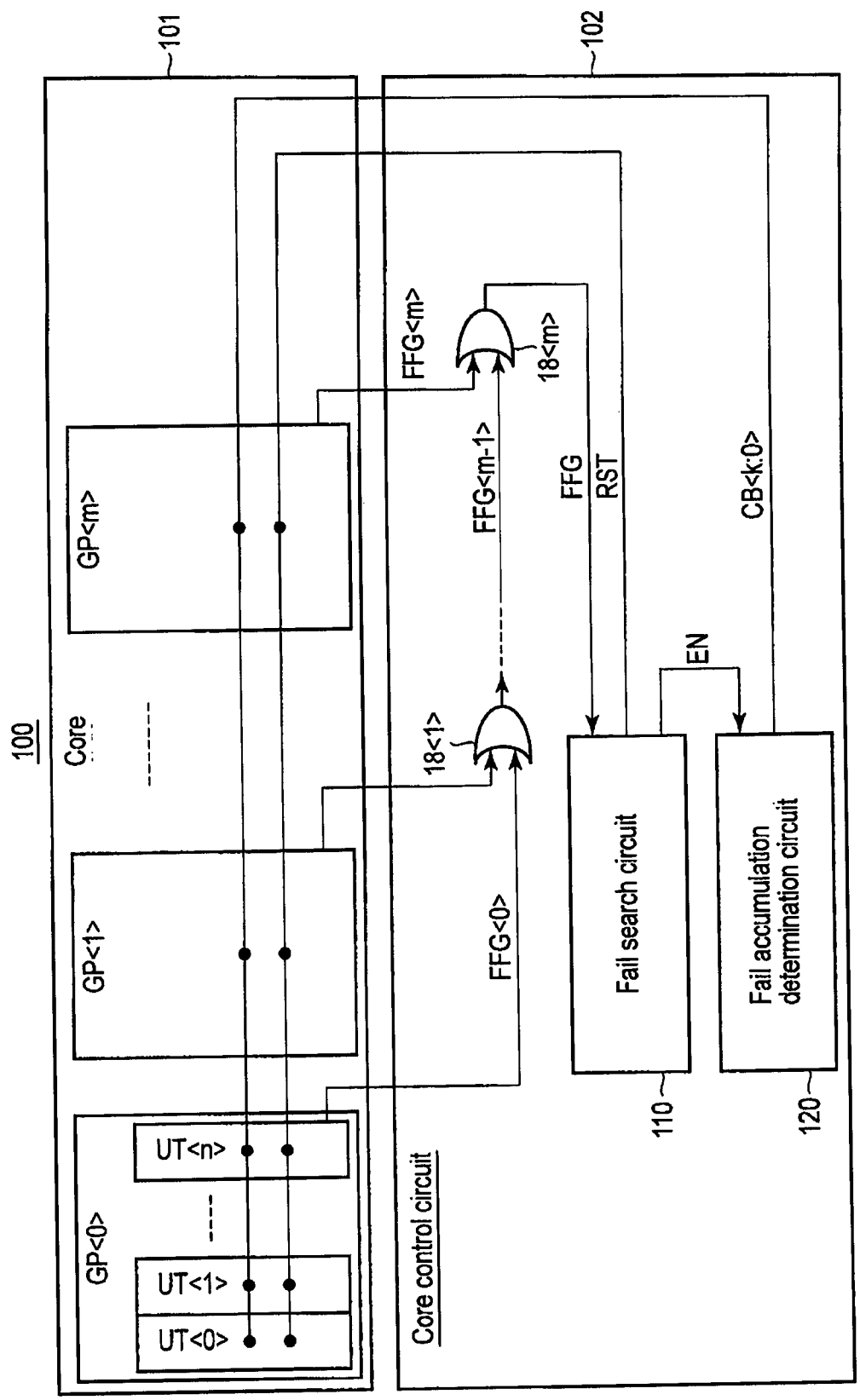
FIG. 14 is a block diagram showing a NAND flash memory according to a comparative example.

A comparative example of a NAND flash memory that can perform the fail bit search operation will now be described. FIG. 14 is a block diagram showing a configuration of a NAND flash memory 100 according to the comparative example.

The NAND flash memory 100 comprises a core 101 including a memory cell array and a core control circuit 102 that controls this core 101. The core 101 comprises (m+1) groups GP<0> to GP<m>. The core control circuit 102 comprises a fail search circuit 110 and a fail accumulation determination circuit 120. All units UT included in the core 101 are connected to a count bus CB<k:0> of (k+1) bits in common, and this count bus CB<k:0> is connected to the fail accumulation determination circuit 120.

Figure 15:
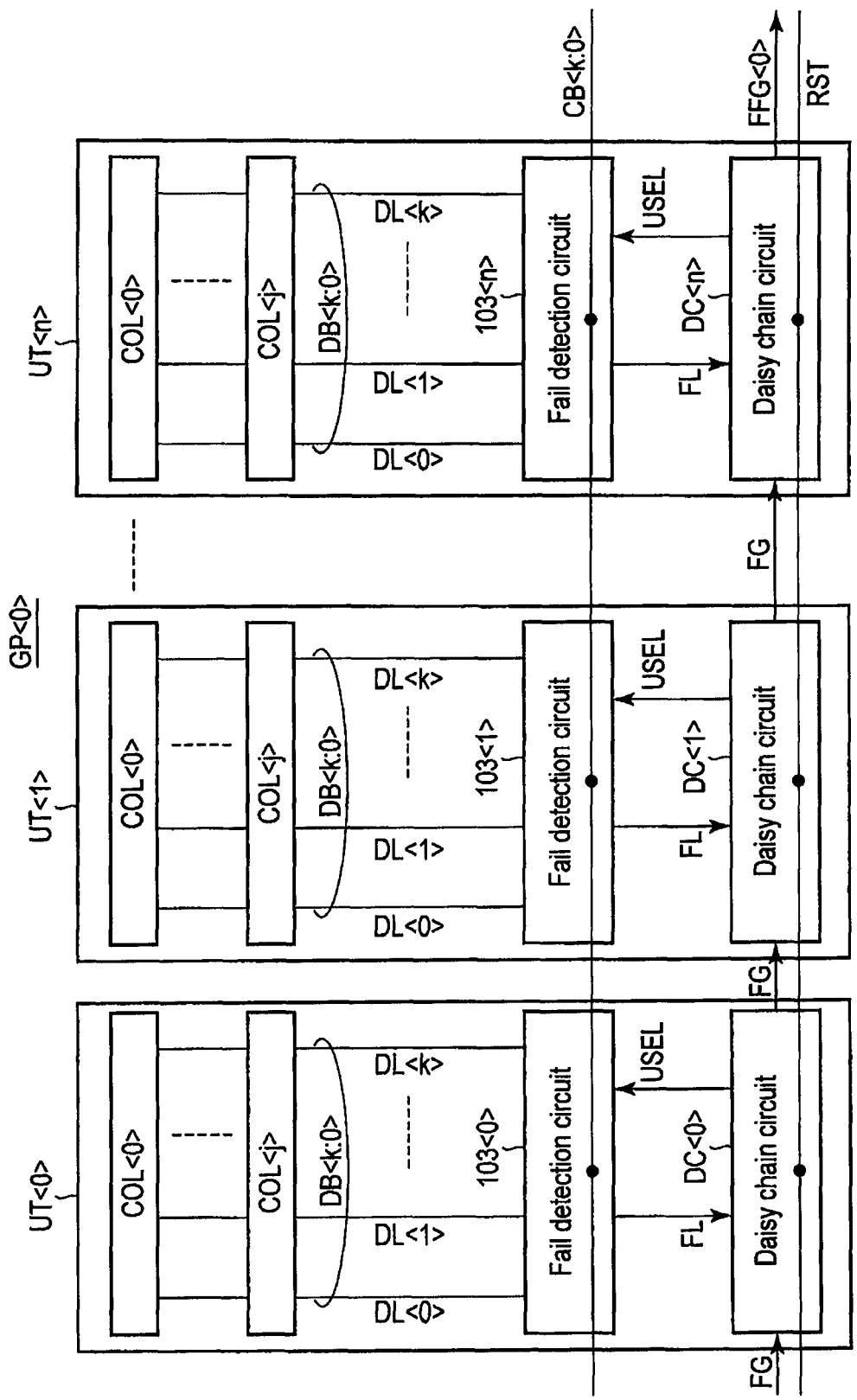
FIG. 15 is a block diagram showing a configuration of a group depicted in FIG. 14.

FIG. 15 is a block diagram showing a configuration of one group G<0>. Configurations of the groups GP<1> to GP<m> are equal to that in FIG. 15. Each group GP comprises (n+1) units UT<0> to UT<n>. Each unit UT comprises a fail detection circuit 103 and a daisy chain circuit DC.

The fail detection circuit 103 detects pass/fail information of the data bus DB<k:0>. If the data bus DB<k:0> has even one piece of fail information, this fail information is supplied to the daisy chain circuit DC through a fail signal line FL and held by the daisy chain circuit DC. The daisy chain circuit DC shifts a logical sum of fail information of the units UT<0> to UT<n> as a flag FG.

Figure 16:
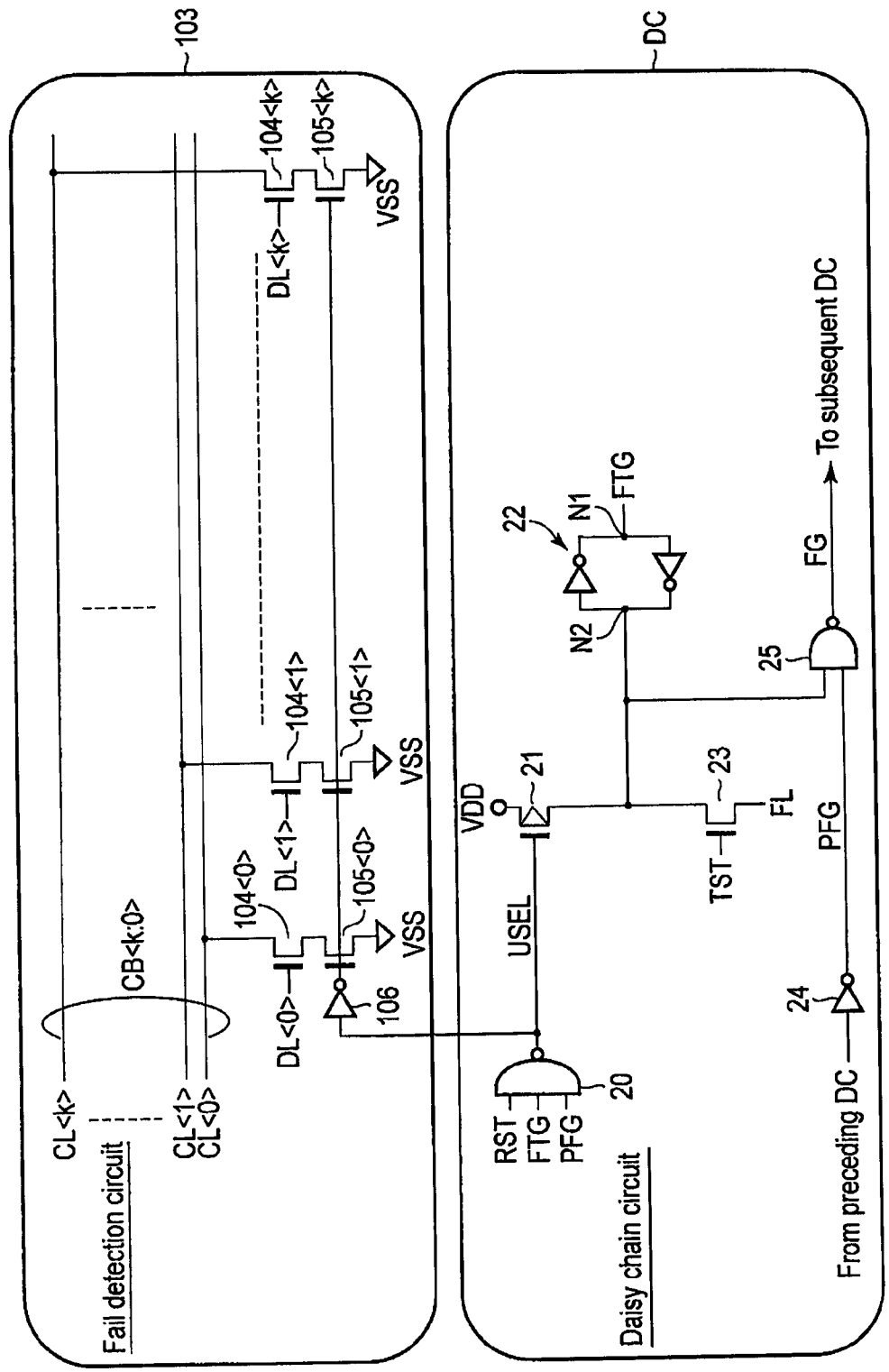
FIG. 16 is a circuit diagram showing a fail detection circuit and a daisy chain circuits depicted in FIG. 15.

FIG. 16 is a circuit diagram showing a configuration of the fail detection circuit 103 and the daisy chain circuit DC. When a tag set signal TST is changed to a high level, a latch circuit 22 in the daisy chain circuit DC latches fail information through the fail signal line FL. A fail tag FTG of the latch circuit 22 is changed to the high level when the data bus DB<k:0> has even one piece of fail information. When the fail tag FTG of a give unit UT is on the high level or when a unit UT which precedes a unit UT in question has a fail column, the flag FG output from the unit in question is changed to the high level. This flag FG becomes a pre-flag PFG of the next unit UT.

A NAND gate 20 activates (a low level) a unit selection signal USEL when three conditions are met, i.e., (1) a reset signal RST is activated (the high level), (2) the fail tag FTG is on the high level, and (3) the pre-flag PFG is on the high level. When the unit selection signal USEL is changed to the low level, the fail tag FTG is reset.

The count bus CB<k:0> is arranged in the fail detection circuit 103. The count bus CB<k:0> is constituted of (k+1) count lines CL<0> to CL<k> corresponding to the number of bits of the data bus DB<k:0>. Each count line CL is grounded through two N-channel MOSFETs 104 and 105 (connected to a ground terminal VSS).

Gates of the N-channel MOSFETs 104<0> to 104<k> are connected to data lines DL<0> to DL<k>, respectively. A signal obtained by inverting the unit selection signal USEL by an inverter 106 is input to each of gates of the N-channel MOSFETs 105<0> to 105<k>.

When the unit selection signal USEL is set to the low level, the N-channel MOSFETs 105<0> to 105<k> are turned on. At this time, the count bus CB<k:0> is charged with, e.g., a power supply voltage VDD by the core control circuit 102. Therefore, when the data line DL corresponds to fail, i.e., when the data line DL is on the low level, the N-channel MOSFET 105 is turned on, and the count line CL is discharged (the count line CL is changed to the low level). When an enable signal EN supplied from the fail search circuit is activated (the high level), the fail accumulation determination circuit 120 counts the number of the count lines CLs which are on the low level and calculates the number of fail bits (accumulated fail count value).

Figure 17:
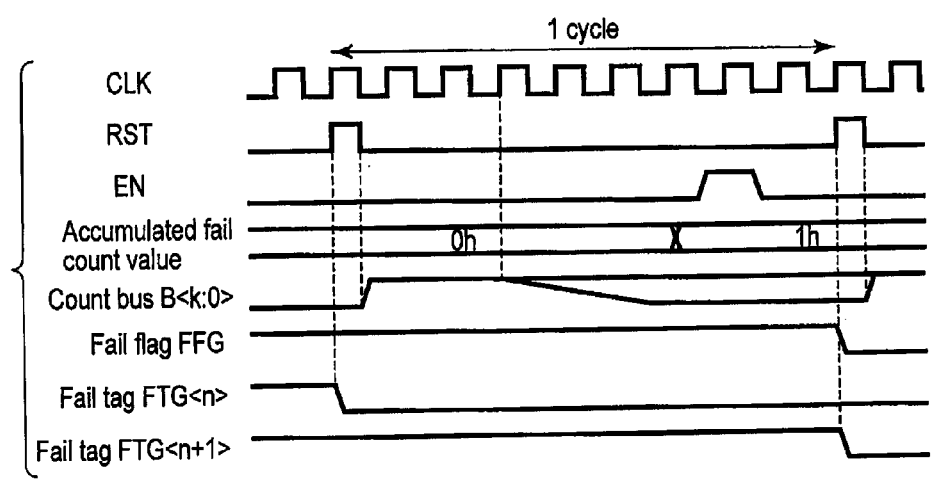
FIG. 17 is a timing chart showing a fail bit search operation.

FIG. 17 is a timing chart showing the fail bit search operation. When a fail tag FTG<n> of a specific unit UT<n> is on the high level or when a unit preceding this unit UT<n> has a fail column, a flag FG output from the unit UT<n> is set to the high level. This flag FG becomes a pre-flag PFG of a next unit UT<n+1>.

A unit UT that counts fail bits is selected based on the pre-flag PFG and the fail tag FTG every time the reset signal RST is toggled, and the number of fail bits is transferred from the selected unit UT to the fail accumulation determination circuit 120 through the count bus CB<k:0>.

To exclude the unit UT which has been through counting the fail bits from the next search, the fail tag FTG<n> is changed to the low level based on the reset signal RST. The fail search circuit 110 assumes that any unit UT has fail bits when the fail flag FTG is on the high level, and it continues counting the fail bits until the allowable bit number or the fail flag FFG is changed to the low level.

In the comparative example having such a configuration, as shown in FIG. 14, the count bus CB<k:0> globally arranged in the core 101 is used to count the fail bits, and this count bus CB<k:0> has a high wiring capacity. In the core 101, transistors (the N-channel MOSFETs 104 and 105) having small drive force are often used to reduce a circuit area, and a drive time of the count bus CB<k:0> is dominant in a fail bit count cycle. Therefore, a standby time of the core control circuit 102 becomes long, and hence fail bit search efficiency is deteriorated. Further, since the count bus CB<k:0> which counts the fail bits is connected to the fail accumulation determination circuit 120, a wiring area is increased.

On the other hand, in the first and second embodiments, the fail detection circuit is eliminated from the comparative example, and the daisy chain circuits are arranged in units of data bus. When such a configuration is adopted, the fail tag=the fail bits is achieved, and the count bus CB<k:0> can be eliminated. In this embodiment, as to the fail bit count, the number of times of resetting the fail tag is counted by the fail accumulation determination circuit, and the search is terminated when a counted-up value exceeds the allowable bit number.

In this embodiment, since the daisy chain circuits are arranged in units of data bus, a transfer delay of the flag is (k+1)-fold of that of the comparative example, and it takes more time as compared with an example of driving the count bus. Therefore, the transfer delay can be reduced to be in the same range as the comparative example by providing a wiring line (a flag bypass 14) that diverts a flag in a unit.

The fail accumulation determination circuit 17 according to this embodiment is constituted of a counter circuit which uses the reset signal as a trigger. As a result, this circuit can be changed to a simple circuit which counts up in accordance with each bit every time the reset signal is toggled while the fail flag FFG is on the high level. Furthermore, since the reset signal is toggled to count fail bits, the search can be carried out in a cycle which is greatly smaller than that when driving the count bus CB<k:0>.

Only one bit can be counted in one cycle in this embodiment, whereas up to (k+1) fail bits can be counted in one cycle since the count bus CB<k:0> is used in the comparative example. However, fail bits are stochastically hardly concentrated in one unit UT, and approximately one or two bits are highly probably fail bits. If fail bits are concentrated in one unit UT, the search is terminated since the number of fail bits exceeds the allowable bit number. A technique of, e.g., byte count that can be operated at a high speed is usually adopted before performing the fail bit search that takes time. Since the count is switched to the bit count after deleting the number of fail bytes to some extent, a probability that fail bits are concentrated in one unit UT is considered to be low.

It is to be noted that each memory cell transistor MT may be configured to hold data of 2 bits or above in the first and second embodiments. In an example that data can be written in 2 bits in each memory cell transistor MT, when a write operation is first carried out in low-order bits and the write operation is then performed in high-order bits, the fail detecting operation may be carried out with respect to each bit or may be performed only after writing data in the high-order bits.

Moreover, although the description has been given as to the example of the fail detecting operation in the data write operation in the first and second embodiments, this fail detecting operation can be likewise applied to a data erase operation. For example, in case of performing an erase verify operation for confirming whether a threshold voltage of the memory cell transistor MT is sufficiently low after a data erase operation, the first and second embodiments can be applied to the fail detecting operation.

Additionally, although the example of the NAND flash memory has been described in the first and second embodiments, for example, NOR, DINOR, and AND flash memories may be used. Further, the present embodiments are not restricted to the flash memory, and it can be applied to general semiconductor memories, e.g., a magnetic random access memory (MRAM) using a magnetoresistive element for a memory cell or a resistive random access memory (ReRAM) using a variable resistive element for a memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   units each including memory cells;
   a data bus connected to each of the units and having data lines;
   holding circuits configured to hold fail information supplied from the unit through the data bus as a verify result after writing data, and provided in association with the data lines, respectively;
   daisy chain circuits configured to shift a flag comprising a logical sum of the fail information held in the holding circuits, and provided in association with the data lines, respectively; and
   a search circuit configured to search for fail bits in the units based on the flag.

2. The device of claim 1, further comprising a determination circuit configured to count the number of fail bits in the units based on a search result of the search circuit.

3. The device of claim 1, wherein the search circuit generates a reset signal for resetting a holding circuit which has been through the search in holding circuits which hold the fail information.

4. The device of claim 3, further comprising:
a determination circuit configured to count the number of times of the reset signal,
wherein a count value of the determination circuit corresponds to the number of fail bits in the units.

5. The device of claim 1, wherein a first daisy chain circuit activates the flag when a holding circuit associated with the first daisy chain circuit holds the fail information or when a second daisy chain circuit preceding the first daisy chain circuit holds the fail information.

6. The device of claim 1, wherein the search circuit terminates the search when the fail information is no longer present in the units or when the number of fail bits in the units exceeds an allowable bit number.

7. The device of claim 1, further comprising:
a bypass connected in parallel to each of the units,
wherein the flag bypasses the daisy chain circuits when the unit has no fail bit.

8. The device of claim 1, wherein
the units are divided into first units and second units to be managed, and
the search circuit searches for fail bits in the first units and fail bits in the second units.

9. The device of claim 8, further comprising: a determination circuit configured to count the number of fail bits in the first and second units based on a search result of the search circuit.

10. The device of claim 8, wherein the search circuit generates a reset signal for resetting a holding circuit which has been through the search in holding circuits holding the fail information.

11. The device of claim 10, wherein the search circuit interleaves a first reset signal of the first units and a second reset signal of the second units.

12. The device of claim 1, wherein
the unit comprises sense amplifiers, and
the sense amplifiers are connected to the data lines, respectively and verify written data after writing the data.

13. The device of claim 12, wherein each of the sense amplifiers detects whether a memory cell is a fail bit.

14. The device of claim 1, wherein the unit is a NAND flash memory.

* * * * *